United States Patent [19]

Keese

[11] Patent Number: 5,627,373

[45] Date of Patent: May 6, 1997

[54] AUTOMATIC ELECTRON BEAM ALIGNMENT AND ASTIGMATISM CORRECTION IN SCANNING ELECTRON MICROSCOPE

[75] Inventor: William A. Keese, Philomath, Oreg.

[73] Assignee: Hewlett-Packard Company, Palo Alto, Calif.

[21] Appl. No.: 664,578

[22] Filed: Jun. 17, 1996

[51] Int. Cl.⁶ .................................................. H01J 37/252
[52] U.S. Cl. .............. 250/310; 250/391 R; 250/396 ML
[58] Field of Search ..................................... 250/310, 311, 250/396 R, 396 ML, 252.1 R, 491.1

[56] References Cited

U.S. PATENT DOCUMENTS 3,852,597  12/1974  Yanaka et al. ........................... 250/311
4,494,000   1/1985  Shii et al. ................................. 250/311

*Primary Examiner*—Jack I. Berman
*Assistant Examiner*—Kiet T. Nguyen

[57] ABSTRACT

A border of a circular specimen defining a high contrast feature is imaged. Multiple border portions are sampled at a magnification showing each portion as a straight edge. For alignment a location indicator signal is generated at each of minimum and maximum focal range. Image translation is detected from the two signals, and alignment automatically adjusted. The process repeats for subsequent border portions at a 90° interval until image translation falls for a sample is less than a threshold. For astigmatism correction border portions are sampled about the entire specimen circumference at a 30° interval. An axis of beam distortion is identified based upon a maximum image translation axis among the samples. Distortion is adjusted along such axis. Then, astigmatism connection signal strength is indexed and astigmatism correction is repeated iteratively until correction for a current iteration is less than a given threshold.

15 Claims, 3 Drawing Sheets

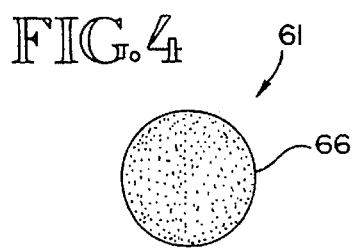
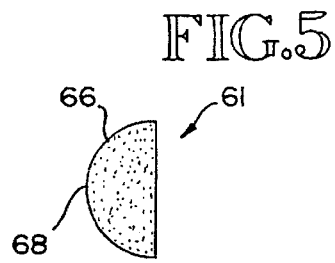
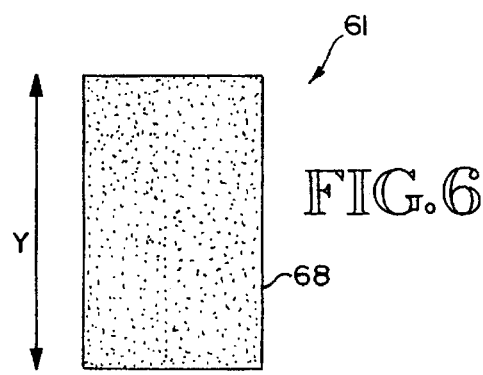
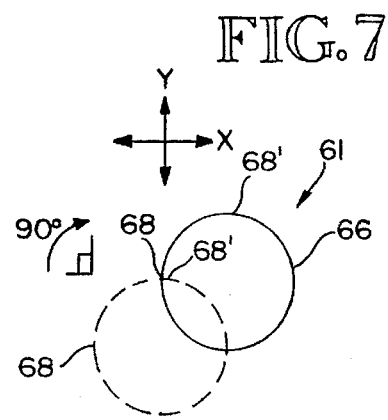
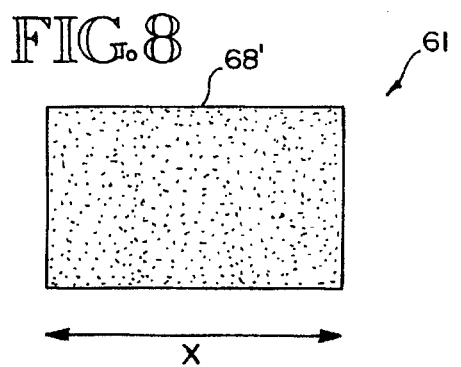
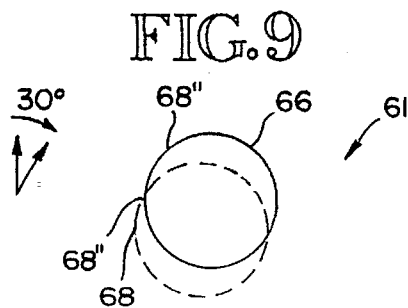
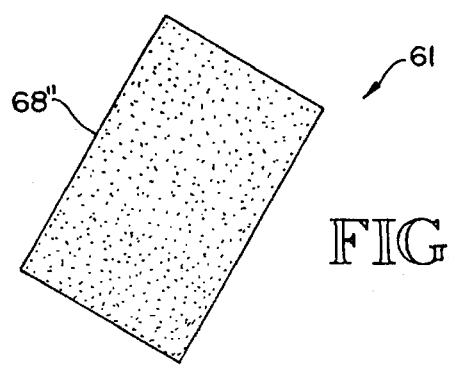

AUTOMATIC ELECTRON BEAM ALIGNMENT AND ASTIGMATISM CORRECTION IN SCANNING ELECTRON MICROSCOPE

BACKGROUND OF THE INVENTION

This invention relates generally to scanning electron microscopes, and more particularly, to a method and apparatus for automatic electron beam alignment and astigmatism correction in scanning electron microscopes.

An electron microscope is capable of resolution and magnification far beyond that of an optical microscope. The resolution limit of a microscope, whether optical or electron, depends upon the wavelength of the imaging wave. The shorter the wavelength, the smaller the limit of resolution of the microscope. For example, objects that are smaller than the wavelength of visible light, roughly 500 nm, are bypassed by light waves and cannot be clearly resolved by an optical microscope.

Electron microscopes, on the other hand, use electron waves instead of light waves as imaging waves. Electron waves occur at wavelengths much shorter than those of visible light. For example, a typical wavelength of an electron wave is about 0.005 nm. The electron microscope's resolution is limited by the size of the electron beam striking the sample. The resolution limit of an electron microscope can be hundreds of times smaller than the resolution limit of an optical microscope. Because an electron microscope can resolve much smaller objects than can an optical microscope, an electron microscope is capable of magnification hundreds of times beyond that of an optical microscope.

Two kinds of electron microscopes include a transmission electron microscope ("TEM") and a scanning electron microscope ("SEM"). The transmission electron microscope forms an image of a specimen by passing electrons through the specimen. A scanning electron microscope generates a small electron beam, focuses the beam with a condenser lens and an objective lens, and forms an image of a specimen by scanning the specimen and detecting secondary electrons emitted from the surface of the specimen.

In a scanning electron microscope, it is important to correctly align the electron beam axis to the axis of the lenses. A misalignment between the electron beam axis and the axis of the lenses results in distortion of the beam, increased final spot size of the beam, and decreased resolution of the SEM. Conventionally, alignment of the objective lens is performed manually by an operator. According to known beam alignment techniques, an operator images a feature of a specimen using a scanning electron microscope. Typically, a sputtered gold-on-carbon standard is used as the specimen. The sputtered gold gives a high yield of secondary electrons, while the carbon does not. Secondary electrons are electrons emitted by the specimen in response to bombardment by the primary imaging system. They typically have energies that are 10%–25% of the incident beam. The operator simultaneously (1) manually adjusts the focus of the objective lens between long and short extremes of the focal range by adjusting current or voltage supplied to the electromagnetic or electrostatic objective lens, respectively; (2) manually adjusts beam alignment by adjusting current or voltage supplied to electromagnetic or electrostatic alignment coils, respectively; and (3) looks for translation of the image of the specimen. In some prior art alignment methods, the objective lens focus is automatically varied between extremes of the focal range (commonly referred to as "wobbling"). When the beam is properly aligned, the operator can perceive no translational motion of the imaged feature. With proper beam alignment, an operator can perceive only a "breathing effect," or magnification and shrinking of the image of the specimen, due to variations in objective lens focus.

One shortcoming of this conventional beam alignment technique is that the manual alignment is highly dependent on operator judgment. For example, perceptions of translational motion may vary between operators. This approach therefore introduces operator inaccuracies and interoperator variations.

In a scanning electron microscope, it is also important to correct any astigmatism in the electron beam. An astigmatism in the electron beam is a focus defect in which the electron beam is not radially uniform. This causes a decrease in the resolution of the image. Connecting an electron beam astigmatism requires identifying an axis of electron beam distortion, and then adjusting radial uniformity in the axis of electron beam distortion to provide a circular electron beam. This adjustment is made via an astigmatism coil. Conventionally, electron beam astigmatism correction is performed manually by an operator. According to known astigmatism correction techniques, an operator images a feature of a specimen using a scanning electron microscope. The specimen is commonly a gold-on-carbon standard, which provides a limited amount of contrast along orthogonal axes. The operator subjectively evaluates sharpness of the imaged feature, and introduces corrections to radial uniformity of the electron beam until a satisfactory image is obtained. Here, a "satisfactory image" means a "sharp" image that is not "blurred," as subjectively determined by the operator.

One shortcoming of this conventional beam astigmatism correction technique is that it also is highly dependent on operator judgment. For example, determinations of what constitutes a satisfactory image may vary between operators. This approach therefore introduces operator inaccuracies and interoperator variations.

Accordingly, there is a need for a more accurate, more consistent, and automated method for electron beam alignment and astigmatism correction in scanning electron microscopes.

SUMMARY OF THE INVENTION

According to the invention, electron beam alignment and electron beam astigmatism correction in a scanning electron microscope are automatically performed. An operator affixes a specimen having a high contrast feature to a movable specimen stage of a scanning electron microscope. In one embodiment, the high contrast feature is the magnified edge of a circular entrance aperture of a Faraday cup. The high contrast feature is imaged, beam characteristics are automatically analyzed, and automatic corrections are made to beam alignment and beam astigmatism.

According to one aspect of the invention, the electron beam is automatically aligned to the objective lens axis. In one embodiment, a magnified edge of the entrance aperture to the Faraday cup is imaged along a first axis substantially orthogonal to the electron beam axis. The magnified edge provides a strong step function in signal intensity and appears as a substantially straight edge at a first directional orientation. The focus of the objective lens is varied between extremes of the focus range. A pattern recognition circuit analyzes the image of the substantially straight edge and generates signals for indicating the straight edge position in the field of view of the image at the extremes of the focus range. A control circuit stores and compares the edge image position indicator signals to determine image translation of the straight edge for the two extremes. In response alignment coil control signals are generated for adjusting electron beam alignment. Another portion along the aperture perimeter is imaged to define a second image sample having a straight edge oriented along a second axis that is substantially orthogonal to both the first axis and the electron beam axis. The image translation analysis and alignment then is repeated for the second image sample. The process repeats iteratively for image samples defining straight edges at successive 90° angular offsets, and stops when the pattern recognition circuit detects substantially no translation of a straight edge at two extremes of the focus range.

According to another aspect of the invention, electron beam astigmatism is automatically corrected. In one embodiment, a circular entrance aperture to a Faraday cup serves as a specimen having a high contrast feature which is sampled to obtain sample images defining straight edges at successive angular offsets about the aperture circumference. The magnified edge of the aperture provides a strong step function in signal intensity enabling each sample image to appear with a substantially straight edge. A pattern recognition circuit analyzes the image of the magnified straight edge of a given sample image and generates a signal for indicating the sharpness of the magnified edge image. A control circuit stores the indicator signal. The specimen is imaged at different locations on the circular aperture, and the sharpness of the imaged edge is determined at different angles where the beam scan intersects the edge. A sharpness indicator signal for each angle is generated and provided to the control circuit for storage. In one embodiment, the imaging is performed at regular intervals, such as 30°, along the entire aperture circumference (i.e., 360°). The control circuit then compares the edge sharpness indicator signals for each image angle. The results for each angle are compared to determine which angle among the 360° is an axis of highest beam distortion. Once this axis is determined, the control circuit generates astigmatism coil control signals for compressing the beam along such axis. The astigmatism control signal magnitude then is indexed and the process repeated iteratively until the axis of highest beam distortion is less than a threshold value. When such condition is reached, the electron beam is considered to be substantially radially uniform.

One advantage of the invention is reduced dependence on operator judgment, thereby improving the consistency, accuracy and reliability of beam alignment and astigmatism correction. Another advantage of the invention is use of a standard raster scan pattern, thereby allowing the present invention to be incorporated into existing scanning electron microscopes with minimal modification.

These and other aspects and advantages of the invention will be better understood by reference to the following detailed description taken in conjunction with the accompanying drawings.

BRIEF DESCRIPTION OF THE DRAWINGS

FIG. 4 is a diagram of a scanning electron microscope image of the entrance aperture of FIG. 3;

FIG. 5 is a diagram of a magnified portion of the image of FIG. 4;

FIG. 6 is a diagram of an even further magnified portion of the image of FIG. 4; and FIG. 7 is a diagram of the aperture of FIG. 3 at different positions for image scanning an edge of the aperture;

FIG. 8 is a diagram of a magnified portion of the image of FIG. 4 offset at approximately 90 degrees from the image portion of FIG. 6;

FIG. 9 is another diagram of the aperture of FIG. 3 at different positions for image scanning an edge of the aperture; and FIG. 10 is a diagram of a magnified portion of the image of FIG. 4 offset at approximately 30 degrees from the image portion of FIG. 6.

DESCRIPTION OF SPECIFIC EMBODIMENTS

Scanning Electron Microscope

Figure 1:
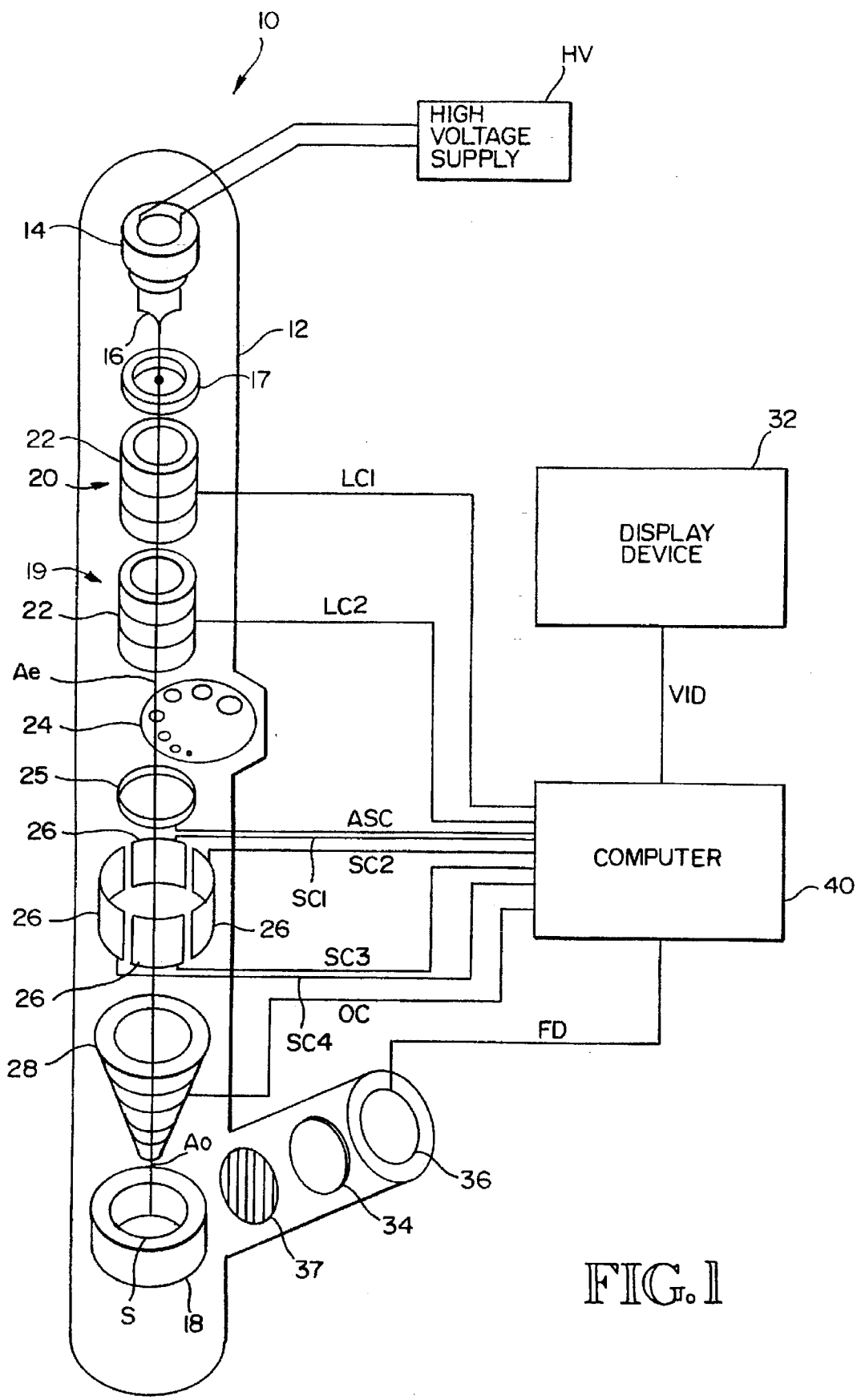
FIG. 1 is a block diagram of a scanning electron microscope according to an embodiment of the present invention.

FIG. 1 shows an exemplary scanning electron microscope 10 for viewing specimens at large magnification (e.g., 1000–100,000 times). The scanning electron microscope 10 includes a housing 12 which defines an evacuated sealed column. A vacuum is maintained inside the column. An electron gun 14 is located at the top of the housing 12. The electron gun 14 includes an electron source 16, such as a tungsten filament, cold field emitter, Schottky field emitter or crystal source (such as lanthanum hexaboride). Electrons emitted from the gun 14 are accelerated by an accelerating aperture 17, and travel along an axis $A_e$ toward a grounded specimen S mounted on a grounded stage 18. The emitted electrons define a beam along the axis $A_e$. The electrons have an energy level between 500 eV and 50,000 eV, and typically 20,000 eV.

Condenser lenses 19, 20 include one or more beam alignment coils 22 respectively, for aligning the electron beam and for condensing the beam into a spot approximately 10 nanometers ('nm') or less across. Condenser lenses 19 and 20 align the electron beam in response to lens control signals LC1 and LC2, respectively. In a preferred embodiment, condenser lenses 19 and 20 are electromagnetic lenses, and LC1 and LC2 are current signals. In an alternative embodiment, condenser lenses 19 and 20 are electrostatic lenses, and LC1 and LC2 are voltage signals. Two condenser lenses 19 and 20 are shown for illustrative purposes only. In some embodiments only alignment and stigmation coils 22, 25 are provided. In other embodiments one condenser lens is provided. In still other embodiments more than two condenser lenses are provided.

An aperture ring 24 allows fine adjustments to be made to the diameter of the spot formed by the electron beam. An astigmatism coil 25 adjusts radial uniformity of the electron beam for correcting electron beam astigmatism. Astigmatism coil 25 is controlled by astigmatism coil control signal ASC. In a preferred embodiment, astigmatism coil 25 is an electromagnetic coil, and signal ASC is a current signal. In an alternative embodiment, astigmatism coil 25 is an electrostatic coil, and signal ASC is a voltage signal.

Scan coils 26 deflect the electron beam in a raster scan pattern on the surface of specimen S in response to scan coil control signals SC1, SC2, SC3, and SC4. Four scan coils 26 are shown in FIG. 1 for illustrative purposes only. It will be appreciated that some embodiments may have more than four scan coils 26, and some embodiments may have less than four scan coils 26. An objective lens 28 has beam focusing coils for focusing the electron beam on specimen S in response to objective lens control signal OC. In a preferred embodiment, objective lens 28 is an electromagnetic coil, and signal OC is a current signal. In an alternative embodiment, objective lens 28 is an electrostatic coil, and signal OC is a voltage signal. Objective lens 28 has an objective lens axis $A_o$.

The electron beam impinging on the specimen causes the specimen to emit secondary electrons from the specimen S surface. These emitted electrons are accelerated toward a positively charged grid 37, and typically have an energy level of about 200 eV. The function of the grid 37 is to accelerate the secondary electrons. The accelerated secondary electrons strike a fluorescent target (e.g., scintillator) 34. When struck, the scintillator 34 emits a flash of light. A flash detector 36 detects the light and converts the flash of light to an electrical pulse signal FD. A display device 32 displays a stream of electrical pulses FD as bright or dark areas, and builds up an image of specimen S line-by-line. Each emitted light flash corresponds to a surface feature of specimen S and is used to define an image portion of such feature.

Figure 2:
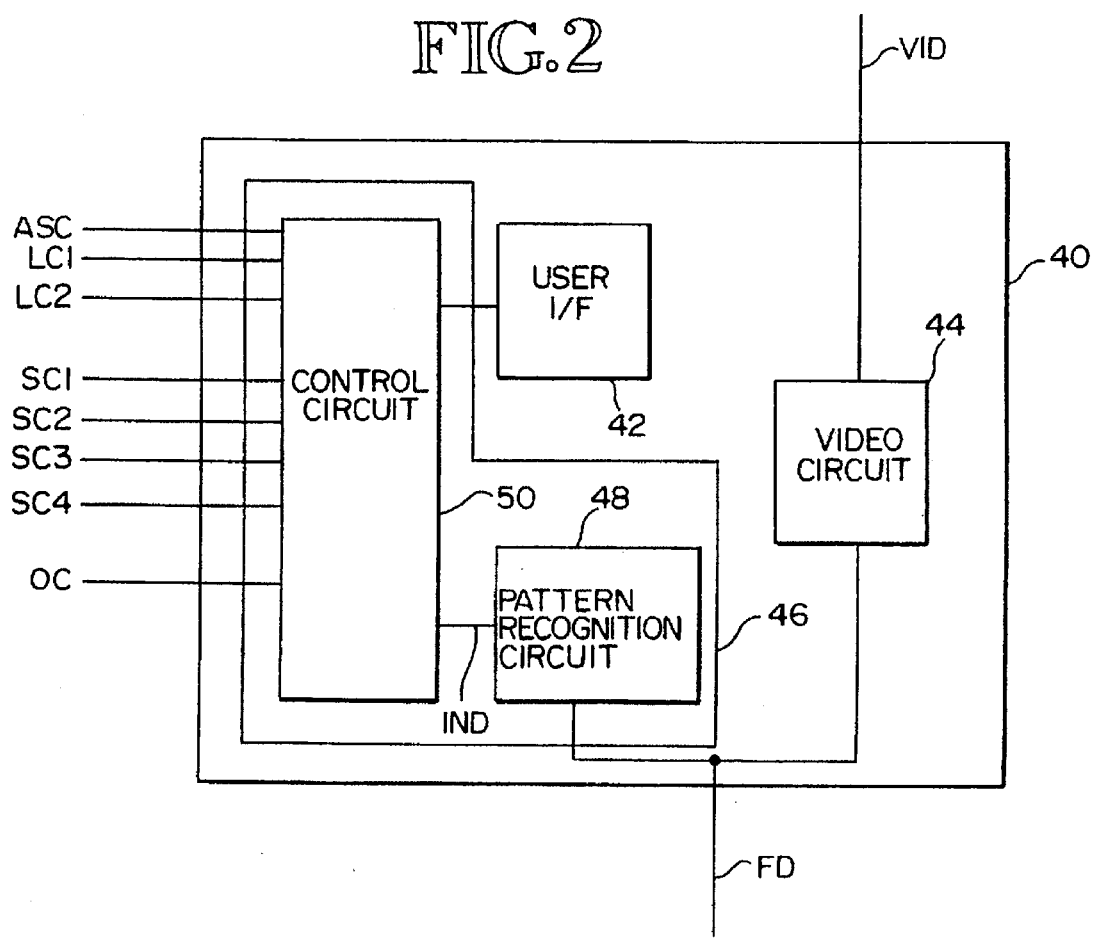
FIG. 2 is a block diagram of a computer having an image processing and pattern recognition system according to an embodiment of the invention.

FIG. 2 shows a block diagram of a computer 40 for monitoring and controlling microscope 10. Computer 40 includes a user interface 42, a video circuit 44, and an imaging processing circuit 46 that includes a pattern recognition circuit 48 and a control circuit 50. Computer 40 is coupled to provide scan coil control signals SC1, SC2, SC3, and SC4 to scan coils 26 for synchronizing the scan pattern of the electron beam with a raster scan pattern on display device 32. Computer 40 is coupled to provide control signals ASC, LC1, LC2, and OC in response to user-generated commands entered at user interface 42. The video circuit 44 is coupled to receive signal FD from flash detector 36 and provide a video signal VID to display device 32.

According to the invention, pattern recognition circuit 48 is also coupled to receive signal FD from flash detector 36. Pattern recognition circuit 48 is also coupled to provide a signal IND to control circuit 50. Pattern recognition circuit 48 analyzes signal FD for imaged features of specimen S, such as position in the field of view and sharpness of the edge image. For example, in one embodiment pattern recognition circuit 48 determines the absolute value of the peak first derivative of the smoothed image intensity of each raster scan line and derives an average over all scan lines. This information is contained in signal IND provided to control circuit 50. Control circuit 50 stores and analyzes signals IND, and calculates corrections to beam alignment and astigmatism. Control circuit 50 generates control signals LC1 and LC2 for automatically correcting beam alignment, and generates control signal ASC for automatically correcting beam astigmatism, as described in detail below.

Figure 3:
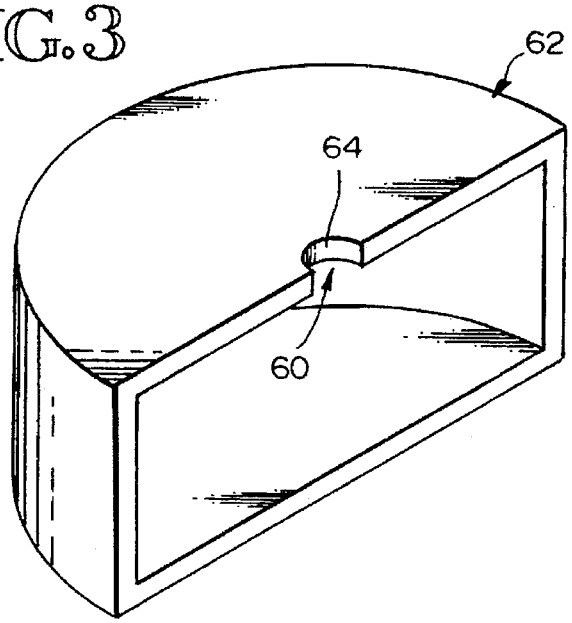
FIG. 3 is a cut-away view of Faraday cup with an entrance aperture.

FIG. 3 shows a cut-away view of a Faraday cup 62 having an entrance aperture 60. The aperture boundary edge 64 serves as a high contrast feature. In one embodiment, the entrance aperture 60 has a diameter of approximately 20 to 60 μm. The Faraday cup has a diameter of approximately 1000-2000 μm, preferably approximately 2000 μm. A circular aperture is preferred for the astigmatism correction method described below.

FIG. 4 shows a scanning electron microscope image 61 of the entrance aperture 60. The image 61 has a high contrast boundary 66 which corresponds to aperture edge 64. A bright external portion of the image 61 occurs where the electrons excite the flash detector 36. Electrons that enter aperture 60 are not reflected, so no secondary electrons are detected by flash detector 36. Aperture 60 thus provides a strong step function in signal intensity at the boundary 66. The image of FIG. 4 corresponds to a magnification of approximately 1500×. The image of FIG. 5 shows the image of aperture 60 magnified about 3000×. Only a portion of the aperture 60 occurs in the image of FIG. 5. As the magnification increases, a smaller portion of the aperture 60 is contained in the field of view. The entrance aperture 60 is positioned such that a portion 68 of boundary edge 64 (as represented by portion 68 of image 61 boundary 66 in FIG. 5) is in the center of the electron beam scan. FIG. 6 shows the aperture 60 image 61 magnified approximately 60,000 times. At such magnification, the edge 64 boundary portion 68 appears as a straight edge on the viewing display 32. The straight edge is a tangent to the sampled boundary portion.

Method Overview

The method of the present invention eliminates the need for an operator to detect image translation for correcting beam alignment and avoids subjective evaluation of image quality for correcting beam astigmatism. Instead, an image processing circuit 46 detects image translation and automatically corrects beam alignment. The image processing circuit 46 also quantitatively evaluates image quality and automatically corrects beam astigmatism. In one embodiment the only operator interaction is to position the Faraday cup with entrance aperture 60 under the electron beam at stage 18 and enter computer commands.

Electron Beam Alignment

The present invention automatically corrects electron beam alignment. An operator moves stage 18 to bring a portion 68 of an edge 64 (see FIG. 3) of aperture 60 under the electron beam, and magnifies such portion 68. In an embodiment in which aperture 60 has a circular entrance diameter of approximately 60 μm, aperture 60 is magnified about 100,000 times. As shown in FIG. 6, the image of magnified boundary portion 68 provides a strong step function in signal intensity and appears as a substantially straight edge. Referring to FIGS. 6 and 7, aperture 60 is first imaged along an axis that is substantially orthogonal to electron beam axis $A_e$. In this case, the axis is the y axis.

The focus of objective lens 28 is varied positively and negatively between extremes of the focal range. In a preferred embodiment, computer 40 automatically varies the focus of objective lens 28. However, this is not necessary. In an alternative embodiment, an operator varies the focus of objective lens 28 by entering commands at user interface 42 in a known manner.

Pattern recognition circuit 48 analyzes the image of magnified boundary portion 68 and generates a signal IND for indicating the position of the image of boundary portion 68 in the field of view. A indicator signal IND is generated for each of the extremes of the focus range. Pattern recognition circuit 48 outputs the respective indicator signals IND to control circuit 50. Control circuit 50 stores and compares portion 68 location indicator signals IND for positions in the field of view of magnified portion 68 at the extremes of the focus range. Control circuit 50 detects any translation of the magnified portion 68 and generates alignment coil control signals LC1 and LC2. Control circuit 50 provides signals LC1 and LC2 to alignment coils 22 for adjusting electron beam alignment.

Samples are taken at a first point 68 on the aperture 60 edge and at a second point 68' on the aperture 60 edge 64.

Preferably the first and second sampled points define orthogonal straight edges when magnified as shown in FIGS. 6 and 8, respectively. In one embodiment, the electron beam is shifted to sample a different edge of the aperture 60. In an alternative embodiment the Faraday cup with entrance aperture 60 is repositioned to sample a different edge of the aperture 60. In each instance the new image is of a straight edge which is 90 degrees offset from the first sample image. Samples also are taken to generate sample images defining respective straight edges at progressive 90° offsets.

FIG. 7 shows an embodiment in which the Faraday cup is repositioned along x and y axes via stage 18 to image a second position 68' on the aperture 60 edge which is 90 degrees offset from the first aperture point 68 imaged. After repositioning, the edge is imaged. FIG. 8 shows an image of the second sample edge. Such second sample edge is oriented along an axis orthogonal to both the first axis (e.g., the y axis) and the electron beam axis $A_z$. In the case shown, the straight edge boundary portion 68 for the second sample is oriented along the x axis. The order of imaging an edge(s) along first and second orthogonal axes may vary. The beam alignment process of detecting image translation and adjusting alignment as described above is repeated for the second sample image and any subsequent sample images. The alignment proceeds in an iterative manner taking images of edges at progressive 90° offsets. The iterations stop when the difference in magnitude of the location indicator signals IND for extremes of focal range for a current sample image and previous sample image are less than a prescribed threshold improvement. The prescribed threshold preferably is proportional to the pixel width of display device 32, the magnification of the sample edges. The prescribed threshold varies for a given system and magnification. An exemplary threshold for a system with approximately 500 pixels in each axis, at 100,000× magnification, and with each pixel approximately 10 nanometers in each dimension, is 5 pixels, or 50 nanometers.

Electron Beam Astigmatism Correction

Electron beam astigmatism also is corrected automatically. An operator moves stage 18 to bring a boundary portion 68 of an edge 64 of aperture 60 under the electron beam for imaging at a scan location. In an embodiment in which the entrance aperture 60 has a diameter of about 60 μm, the boundary portion 68 is magnified about 100,000×. FIG. 6 shows the image of the boundary portion 68 oriented along the y axis. Additional boundary portions also are sampled around the circumference of the circular aperture 60 at a regular interval. In one embodiment samples are taken at progressive 30° intervals. In such example 12 aperture boundary locations are imaged. The precise angular interval may vary.

FIGS. 6 and 10 show first and second sample images of respective boundary portions 68, 68". Boundary portion 68 is shown at a magnification in which it appears as a straight edge oriented along a first direction (see FIG. 6). Boundary portion 68" also is shown at a magnification in which it appears as a straight edge, but oriented along a second direction (see FIG. 10). To image edges of the aperture 60 at a 30 degree interval the electron beam is shifted to sample the different boundary points of the aperture 60. In an alternative embodiment the Faraday cup with entrance aperture 60 instead is repositioned to enable sampling of the different boundary points of the aperture 60. FIG. 9 shows the aperture 60 at first and second positions. The aperture 60 is being repositioned by stage 18 such that a different portion of the magnified edge 68 is imaged. In the embodiment illustrated the second sample edge point 68" defines a straight edge under magnification which is offset by thirty degrees from the first sample edge point 68. The precise angular interval, as previously described, may vary.

For each sample position, the pattern recognition circuit 48 computes an indicator of boundary sharpness. An example of an indicator of boundary sharpness is an average over all scan lines of the absolute value of the peak first derivative of the smoothed image intensity for each raster scan line. Pattern recognition circuit 48 provides this indicator to control circuit 50 as indicator signal IND. Control circuit 50 stores signal IND. Once samples are achieved over an approximately 360 degree range, the control circuit 50 compares the sharpness indicator signals IND for each sample point to determine the distortion at each sample point. The distortions at each sample point then are compared to determine an axis of beam distortion. A mis-shaped electron beam gives a sharp image of magnified boundary portion 68, 68" when an elongation in the electron beam is scanned parallel with the boundary portion. However, the image of the magnified boundary portion is less sharp when an elongation in a mis-shaped electron beam is scanned perpendicular with such portion. Therefore, the poorer the quality of the image of substantially straight edge portions 68, 68" the greater the distortion of the beam in an axis normal to edge portion 68 at that point. Once this axis is determined, control circuit 50 generates astigmatism correction signals ASC for compressing the electron beam to reduce elongation along this axis.

The astigmatism correction signal magnitude then is incremented by an index amount. The specimen positioning, image scanning, distortion determining, astigmatism correction and indexing steps then are repeated iteratively. The iterations continue until a substantially radially uniform beam is obtained. In one embodiment the electron beam is determined to be substantially radially uniform when adjustments to the electron beam along an axis of beam distortion result in less than a first threshold improvement in sharpness for sequential iterations. The first threshold is determined from the difference of IND values between best and worst values obtained. An exemplary first threshold for a 30 nm electron beam spot size at a magnification of 100,000× is approximately 20%.

Once the beam is determined to be substantially radially uniform, the strength of the astigmatism correction is indexed. To do so, the magnitude of astigmatism correction signal ASC is compared to the magnitude of sharpness indicator signal IND for each rotated image. The steps of repositioning about 360 degrees, imaging, distortion determination and astigmatism correction are repeated for multiple indexes of the astigmatism correction signal strength. The indexing continues until a "most" radially uniform beam is obtained. The "most" radially uniform beam is determined to be the beam for which adjustments along an axis of beam distortion result in less than a second threshold improvement in sharpness of edge E image. Improvement is determined by comparing the magnitude of signal IND. In one embodiment the second threshold is determined based upon a difference of IND values between the best and worst values obtained. An exemplary second threshold, for a 30 nm electron beam spot size at a magnification of about 100,000 is approximately 10%.

Meritorious and Advantageous Effects

One advantage of the invention is reduced dependence on operator judgment, thereby improving the consistency, accuracy and reliability of beam alignment and astigmatism correction. Another advantage of the invention is use of a standard raster scan pattern, thereby allowing the present invention to be incorporated into existing scanning electron microscope designs without changing scan patterns.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method for automatically aligning electron beam axis to an objective lens axis in a scanning electron microscope, the method comprising the steps of:

imaging a specimen at a first point within a focal range of an objective lens to form a first image sample defining a straight edge oriented in a first direction;

generating a first indication signal of the first image at the first point within the focal range of the objective lens, the first indication signal indicative of a first position of the straight edge within a field of view of the microscope;

imaging the specimen at a second point within the focal range of the objective lens;

generating a second indication signal at the second point within the focal range of the objective lens, the second indication signal being indicative of a second position of the straight edge within a field of view of the microscope;

comparing the first and second indication signals for determining translation of the straight edge;

adjusting alignment of the electron beam axis to the objective lens axis in the first direction;

repeating the steps of imaging at a first point, generating a first indication signal, imaging at a second point, generating a second indication signal, comparing and adjusting for subsequent image samples of the specimen defining a straight edge, wherein for each subsequent image sample the straight edge is in a direction orthogonal to the direction of the previous sample, said repeated step of adjusting for each one subsequent sample comprising adjusting alignment of the electron beam axis to the objective axis in the direction of the straight edge of said one subsequent sample, and wherein said repeating occurs until the first position differs from the second position by less than a predetermined threshold.

2. The method of claim 1, in which the first point within the focal range is a first extreme of the focal range and the second point within the focal range is a second extreme of the focal range different from the first extreme.

3. The method of claim 1 wherein the step of adjusting comprises the step of generating an alignment coil control signal.

4. The method of claim 1 wherein the specimen is a circular entrance aperture of a Faraday cup and wherein the first image sample and each subsequent image sample is magnified to define a respective straight edge within a scan plane of the scanning electron microscope.

5. A method for automatically correcting electron beam astigmatism in a scanning electron microscope, the method comprising the steps of:

image scanning a specimen at a first magnification to define a plurality of image samples, each image sample defining a straight edge oriented in a direction at the first magnification;

generating an indication signal of sharpness for each one of the plurality of image samples;

determining an axis of electron beam distortion from the respective generated indication signals; and adjusting electron beam shape along the axis of electron beam distortion.

6. The method of claim 5 in which the specimen is circular and in which the step of image scanning defines a plurality of image samples taken at a regular interval about a circumference of the specimen, each one of the plurality of image samples having a respective straight edge oriented at a tangent angle to the specimen circumference at a sample point from which the sample image is scanned.

7. The method of claim 5, in which the specimen is an edge of a circular entrance aperture to a Faraday cup magnified to appear as a straight edge within a scan plane of the scanning electron microscope for each of the plurality of image samples.

8. The method of claim 5 wherein said step of determining an axis of electron beam distortion comprises the step of comparing each of the sharpness indication signals, the axis of beam distortion being substantially orthogonal to the imaging angle having an indication signal of smallest amplitude.

9. The method of claim 5 wherein said step of adjusting the electron beam comprises the step of generating an astigmatism coil control signal.

10. The method of claim 9, further comprising the step of indexing magnitude of astigmatism coil control signal; and iteratively repeating the steps of image scanning, generating, determining, adjusting and indexing indication signals for an axis of electron beam distortion indicate that sharpness is improved relative to a given threshold.

11. The method of claim 10, wherein said indexing step comprises the step of comparing astigmatism coil control signal amplitude with sharpness indication signal amplitude for the imaging angle associated with the axis of beam distortion.

12. A combination of a scanning electron microscope and an apparatus for calibrating the scanning electron microscope, comprising:

means for image scanning a specimen to generate a plurality of image samples, each image sample defining a straight edge at a scanning magnification;

means for automatically determining image translation of the straight edge within a field of view of the microscope between first and second extremes of focal range for each of the plurality of image samples;

means for automatically adjusting alignment of electron beam axis to an objective lens axis upon a determination of image translation which is beyond a first threshold;

means for discontinuing alignment upon determination of image translation is found to be less than the first threshold;

means for generating an indication signal of sharpness for each one of the plurality of image samples;

means for determining an axis of electron beam distortion from the respective generated indication signals; and means for adjusting electron beam shape along the axis of electron beam distortion.

13. The combination of claim 12 in which the means for image scanning defines a plurality of image samples having respective straight edges oriented at a common angular interval.

14. The combination of claim 12 in which the specimen is an edge of a circular entrance aperture to a Faraday cup magnified to appear as a straight edge within a scan plane of the scanning electron microscope for each of the plurality of image samples.

15. The combination of claim 12, further comprising means for generating an astigmatism coil control signal and means for indexing magnitude of astigmatism coil control signal.

* * * * *